US012253587B2

(12) United States Patent
Bolding et al.

(10) Patent No.: US 12,253,587 B2
(45) Date of Patent: Mar. 18, 2025

(54) SYSTEM AND METHOD FOR PASSIVELY SHIELDED MODULAR PLATFORM FOR PARALLEL RADIOFREQUENCY PULSE TRANSMIT AND/OR RECEIVE

(71) Applicant: Case Western Reserve University, Cleveland, OH (US)

(72) Inventors: Nicholas Reid Bolding, Cleveland Heights, OH (US); Mark A. Griswold, Shaker Heights, OH (US)

(73) Assignee: Case Western Reserve University, Cleveland, OH (US)

( * ) Notice: Subject to any disclaimer, the term of this patent is extended or adjusted under 35 U.S.C. 154(b) by 168 days.

(21) Appl. No.: 18/181,863

(22) Filed: Mar. 10, 2023

(65) Prior Publication Data

US 2023/0288512 A1 Sep. 14, 2023

Related U.S. Application Data

(60) Provisional application No. 63/318,583, filed on Mar. 10, 2022.

(51) Int. Cl.
*G01R 33/54* (2006.01)
*G01R 33/381* (2006.01)
*G01R 33/421* (2006.01)

(52) U.S. Cl.
CPC ......... *G01R 33/543* (2013.01); *G01R 33/381* (2013.01); *G01R 33/4215* (2013.01)

(58) Field of Classification Search
CPC .............. G01R 33/543; G01R 33/381; G01R 33/4215; G01R 33/365; G01R 33/422; G01R 33/3664
See application file for complete search history.

(56) References Cited

U.S. PATENT DOCUMENTS

2009/0134876 A1* 5/2009 Griswold ........... G01R 33/3415
324/318
2018/0081003 A1* 3/2018 Atalar ................... A61B 5/055

* cited by examiner

*Primary Examiner* — G. M. A Hyder
(74) *Attorney, Agent, or Firm* — Quarles & Brady LLP

(57) ABSTRACT

The present disclosure provides transmit/receive (T/R) systems for NMR or MRI systems. In one configuration, the systems and methods provided herein may use passively-shielded coils that are compatible with low-field operational environment to replace conventional T/R systems and spatial gradient systems. In some configurations, a low-field imaging T/R system is provided that is designed for nuclear magnetic stimulation and local flux sensitivity, while automatically rejecting incident radiant electromagnetic noise. The design advantageously leverages low required frequencies to distribute the pulse synthesis task, yielding a smaller system with easier maintenance and lower cost. The system may include distributed coil nodes that include a primary radiofrequency (RF) coil configured to transmit and receive RF signals and a secondary coil configured to passively shield the primary RF coil.

22 Claims, 6 Drawing Sheets

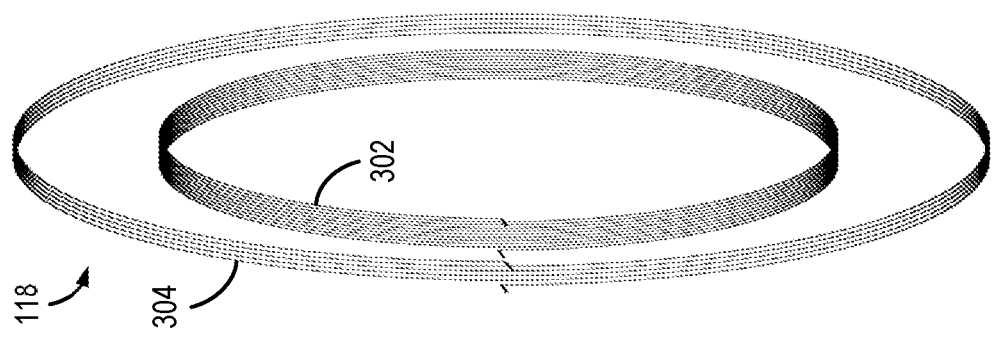
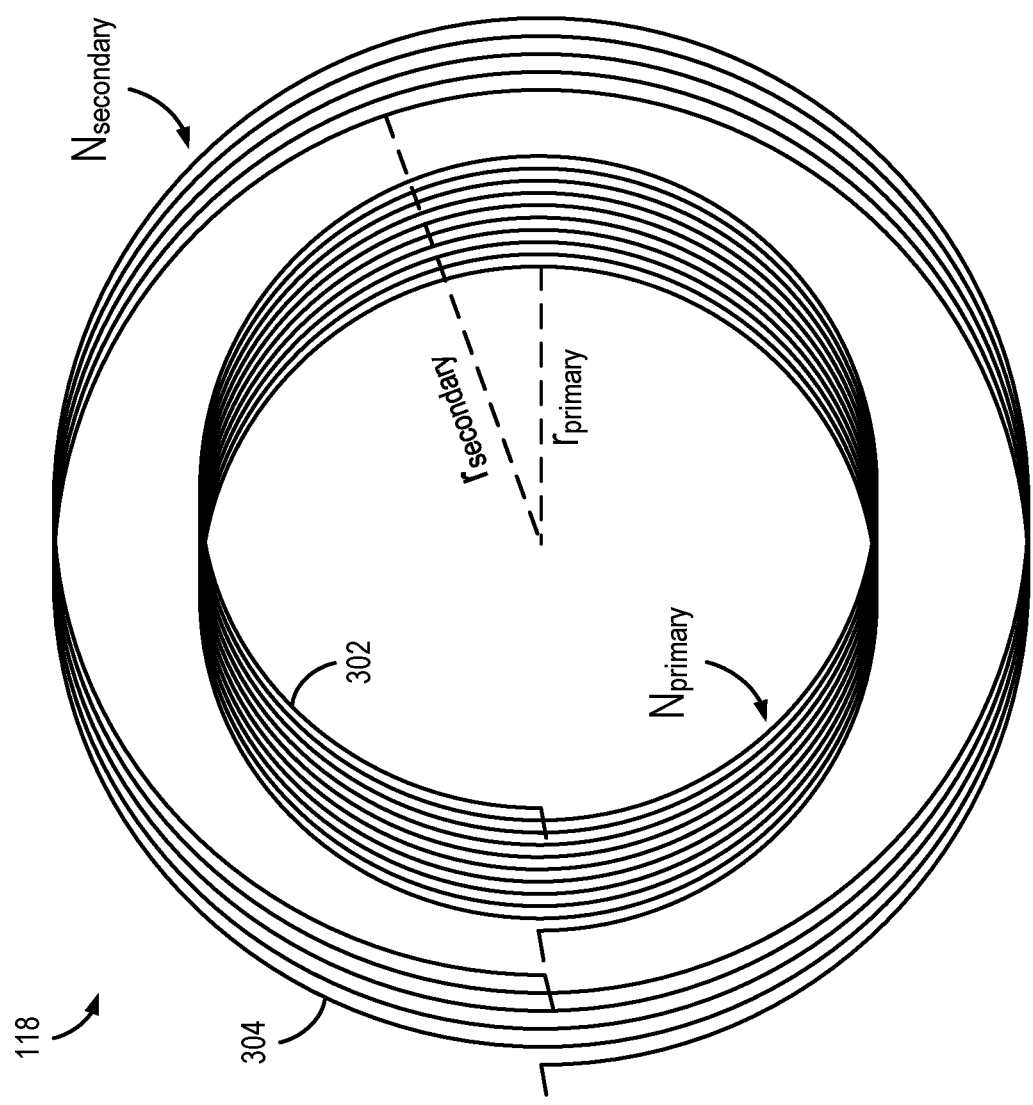
FIG. 3B
FIG. 3A

SYSTEM AND METHOD FOR PASSIVELY SHIELDED MODULAR PLATFORM FOR PARALLEL RADIOFREQUENCY PULSE TRANSMIT AND/OR RECEIVE

CROSS-REFERENCE TO RELATED APPLICATIONS

This application claims priority under 35 U.S.C. § 119 to U.S. Provisional Patent Application No. 63/318,583 filed Mar. 10, 2022, the entire contents of which is incorporated herein by reference.

STATEMENT REGARDING FEDERALLY SPONSORED RESEARCH

N/A

BACKGROUND

In order to obtain data with sufficient signal to noise ratio (SNR) from a nuclear magnetic resonance (NMR) experiment on a bulk, body-temperature sample, most clinical and research magnetic resonance imaging (MM) systems have field strengths of at least 0.5 Tesla and often at least 1.5 T and higher. These scanners are designed to generate 0.5 T to 7 T spatially homogeneous magnetic fields across the entire sample. To achieve a high homogenous field across a human body, superconducting magnets are typically required, which are physically large and expensive to build, install, and maintain. Thus, current clinical systems are generally limited in availability to large institutions in developed countries.

Moreover, standard MRI requires maximally fast and strong linear gradients in the main magnetic field across the sample that change at fast speeds. The higher field strengths are also associated with increasing frequencies of the radiofrequency (RF) NMR stimulus and response of the sample, resulting in inconvenient wavelengths for sample penetration, transmit chain design, and signal path. Thus, high-power low-efficiency amplifiers and careful design are used, further increasing cost, maintenance requirements, and site requirements.

Fortunately, recent techniques have introduced quantitative imaging strategies, like magnetic resonance fingerprinting (MRF), which have challenged the classic paradigm of MM. Some have theorized that these advanced techniques could be used to lower SNR requirements and, in some cases, even eliminate the need for gradients and most RF transmit amplitude modulation, which could be used to substantially reduce some of the most-stringent engineering constraints. These systems could greatly reduce costs and system size by using less expensive main magnets and gradients and lower frequency transmit/receive (T/R) systems. However, even with these reductions in costs, such NMR or MM systems are still extremely complex and expensive to purchase and maintain.

The present disclosure provides systems and methods that can be used to further reduce the cost and complexity of salient components of NMR or MRI systems.

SUMMARY OF THE DISCLOSURE

The present disclosure addresses the aforementioned drawbacks by providing systems and methods for transmit/receive (T/R) systems of NMR or MM systems that use passively shielded coils that are compatible with low-field operational environment to replace conventional T/R systems and spatial gradient systems. In one non-limiting example, a radiofrequency (RF) system is provided for use with MM or NMR systems. The RF system may include a network of nodes, including a plurality of coil nodes that may be passively shielded. The passively shielded coil nodes may include a primary RF coil that can stimulate and measure an RF signal and a secondary RF coil that may be configured to passively shield the primary coil. The primary and secondary coils can be characterized by primary and secondary loop sizes and numbers of loop turns, respectively, in order to control a total flux ratio. The coil nodes may further include a control system that includes a power module coupled to the respective coil node and configured to control delivery of power to the coil node from a power supply.

In some aspects of the present disclosure, an RF system for MRI or NMR is provided that includes a plurality of coil nodes. Each of the coil nodes may include a primary multi-turn RF coil that can transmit and receive RF signals and a secondary multi-turn coil that passively shields the primary coil. The system may further include a control system that includes a plurality of power modules positioned on respective coil nodes. Each of the power modules is configured for switch mode operation to controllably deliver power from a power supply to the respective coil node.

In another aspect of the present disclosure, an RF system is provided for MRI or NMR processes. The system may include a center node and a plurality of coil nodes. Each of the coil nodes may include an RF coil and a control system. The control system may include a current mode class D topology with field effect transistors that form a power module. The power module may control the delivery of power from a power supply to the coil nodes using switch mode operation.

In another aspect of the present disclosure, an RF system is provided that includes a center node in communication with a plurality of passively shielded coil nodes. Each coil node includes a primary RF coil with a primary loop size and number of turns and a secondary coil with a secondary loop size and number of turns. The secondary coil is configured to passively shield the primary coil based on the primary loop size and number of turns and secondary loop size and number of turns that determine a total flux ratio.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

BRIEF DESCRIPTION OF THE DRAWINGS

FIG. 3A illustrates one non-limiting example of a passively shielded transmit/receive radiofrequency coil in accordance with the present disclosure.

FIG. 3B shows a perspective view of a passively shielded transmit/receive radiofrequency coil in accordance with the present disclosure.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The present disclosure provides transmit/receive (T/R) radiofrequency (RF) systems for NMR or MRI systems and methods for using such systems that overcome the challenges of traditional T/R systems in NMR and MRI. In one configuration, the systems and methods provided herein may use passively-shielded coils that are compatible with low-field operational environment to replace conventional T/R systems and spatial gradient systems. In some configurations, a low-field imaging T/R system is provided that is designed for nuclear magnetic stimulation and local flux sensitivity, while automatically rejecting incident radiant electromagnetic noise. The design advantageously leverages low required frequencies to distribute the pulse synthesis task, yielding a smaller system with easier maintenance and lower cost.

Figure 1:
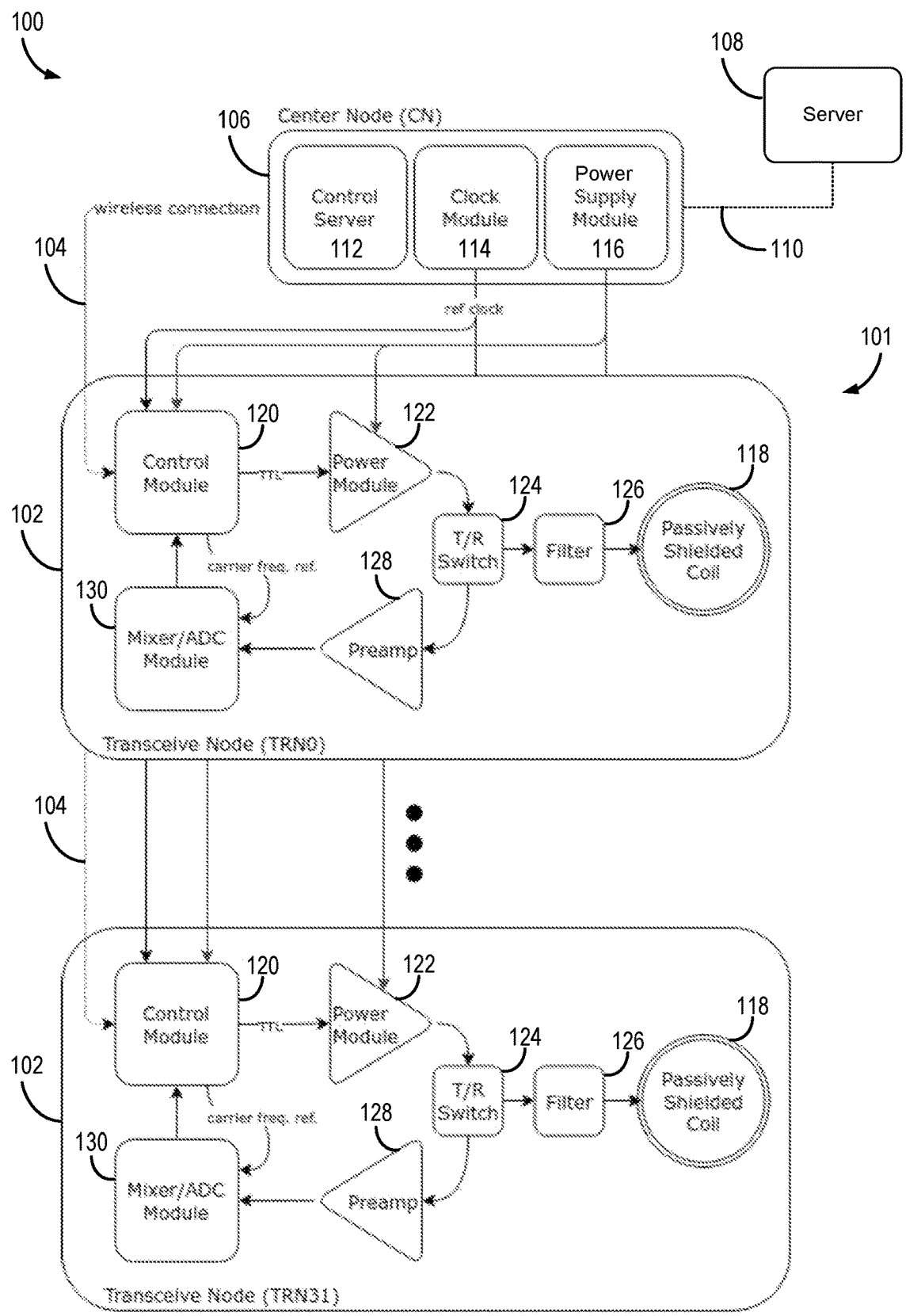
FIG. 1 shows a block diagram illustrating the components of an example transmit/receive radiofrequency (RF) system in accordance with the present disclosure.

Referring first to FIG. 1, a radiofrequency (RF) system 100 in accordance with the present disclosure can include a network 101 of one or more passively shielded coil nodes that may be transceive nodes (TRN) 102, which may include distributed local coil units 118 that may be passively shielded. The local coil units 118 spatially distributed in various patterns, with or without overlap between neighboring coil units 118. Such spatial distribution of the coil units 118 may allow for spatial encoding of the RF signals.

The TRNs 102 within the network 101 may include transmit node (TN) components and receive node (RN) components, which will be described in more detail. The network 101 of TRNs 102 is connected to a center node (CN) 106, which can orchestrate parallel transmission sequences and send received data to a server 108 for processing via a wireless or other connection 110.

The CN 106 can include a control server 112, a clock module 114, and a power supply module 116. The control server 112 may provide a control signal to each TRN 102 by a wireless or other connection 104. The clock module can supply a reference clock signal to each TRN 102. The power supply module 116 may include an AC-DC or DC-DC converter, which may provide low frequency signals, or a battery as a power supply. The power supply module 116 can provide power to the components of the TRNs 102.

The TRNs 102 may also include TN and RN components. For example, the TN components can collectively form a drive coupled to the coil unit 118 such that the TN components drive the coil unit 118 during signal excitation. The RN components can record signal that is induced in the coil unit 118 during data acquisition. The TN components may include a control module 120 and a power module 122, the RN components may include a preamplifier 128 and a mixer and analog to digital converter (ADC) module 130. A T/R switch 124 can be used to switch back and forth between the TN and RN components. The various components of the TRNs 102 (e.g., 120, 122, 128, 130, 124, and 126) may be housed directly on the coil unit 118.

Each TRN 102 also includes the coil unit 118 within the network of TRNs 102. The coil unit 118 may include transmit (Tx), receive (Rx), or T/R radiofrequency coils (RF) that may be passively shielded. As will be explained, each coil unit 118 may include a primary RF coil having a primary loop size and a primary number of turns. The "loop size" may be a radius or diameter, if the loop is circular, or may be a distance between opposite sides if not circular. The coil unit 118 may also include a secondary RF coil configured to passively shield the primary RF coil by having a secondary loop size and a secondary number of turns selected based on a total flux ratio that is a function of the primary loop size and the primary number of turns.

Figure 2:
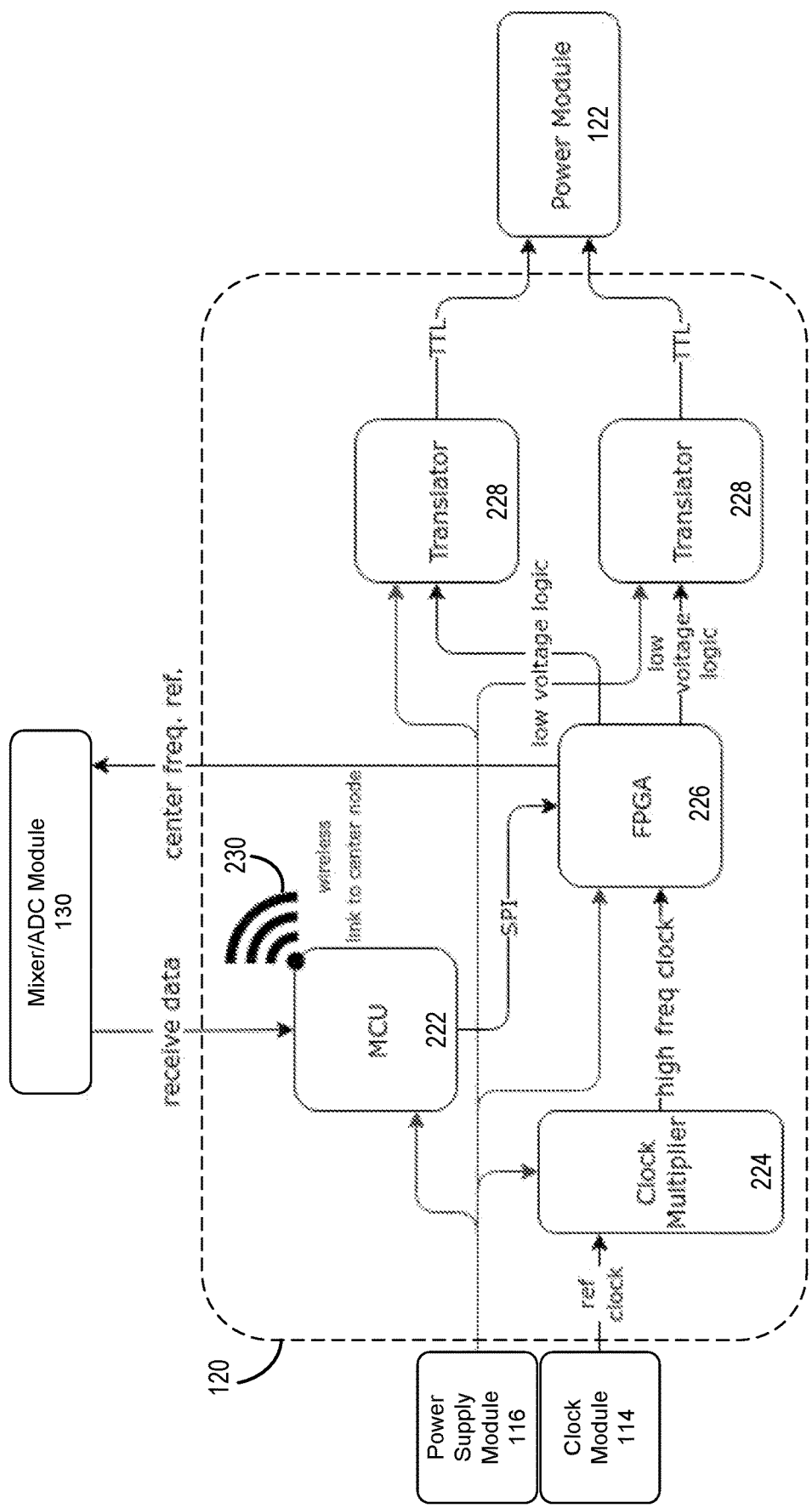
FIG. 2 is a block diagram of components of an example control system that can implement the methods of the present disclosure.

The control module 120 is further illustrated in FIG. 2. Components of the control module 120 can include a microcontroller (MCU) 222, a clock multiplier 224, a field programmable gate array (FPGA) 226, and one or more translators 228, which can all be powered by the power supply module 116 of the CN 106. The microcontroller 222 can receive an FPGA configuration from the CN 106, which may be received via a wireless link 230 or other connection between the microcontroller 222 and the CN 106. The clock multiplier 224 can receive the reference clock signal from the clock module 114 of the CN 106 and multiply the reference signal to create a high frequency clock signal. The FPGA 226 can receive the FPGA configuration from the microcontroller 222 via a serial peripheral interface (SPI) or other communication method and high frequency clock signal from the clock multiplier 224. The FPGA 226 can use the FPGA configuration and high frequency clock signal to generate an RF pulse. The RF pulse can be represented by transistor-transistor logic (TTL) or may be represented by low voltage logic and translated by translators 228 into the form of TTL signals. In this way, the TN can use the FPGA configuration and the clock signal to generate an RF pulse in the form of two TTL signals.

Referring again to FIG. 1, the TTL signals can be used by the power module 122, which may include field effect transistors (FETs) that can be operated by current mode class D (CMCD). The power module 122 may be configured for switch mode operation to control the delivery of power from the power supply to the plurality of coil nodes. Each individual coil node 102 may include one or more power module 122 that may be housed directly on the coil node 102. In this way, each coil node 102 can be individually controlled by the corresponding control module 120 and power module 122. For example, when the T/R switch 124 connects the coil unit 118 with the TN components, the power module 122 can switch the polarity or delivery of the grossly variable power supply across the coil unit 118 at high efficiency. In this way, the power module 122 can provide fine control of the power provided by the lower frequency power supply module 116.

The signal can be further cleaned by the filter 126 to remove noise or other unwanted frequencies. The filter 126 may be a passive network and may form a resonant load with the coil unit 118. This may allow the transmit amplifier to have a less reactive load and the coil unit 118 to have a higher quality-factor (Q) in receive mode.

As a non-limiting example, the system can be switched at 50% duty cycle with dynamic phase modulation for flat amplitude phase modulated pulses. Alternatively, the system may be configured to switch the transmit frequency or phase to produce phase and frequency modulation. Various switching patterns can be used to adjust the power delivery efficiency, provide amplitude modulation, or adapt the load.

The system can generate various RF pulses across the coil unit 118, including magnitude-modulated or frequency-modulated RF pulses at any desired duty cycle. Advantageously, the high efficiency of the system described can eliminate the need for large cooling systems and high supply power that are typically used in MR systems. The whole TN can be also can be placed directly on a local coil, eliminating the need for high power RF transmission lines.

The coil unit 118 can include local RF coils that can be tuned to resonate at the driving frequency with minimal real impedance to generate the maximum magnetic field. Referring now to FIGS. 3A and 3B, the coil unit 118 can include a primary T/R coil 302 with one or more turns that alternatingly transmits and receives the RF signal to/from the subject. In the illustrated, non-limiting example, the coil unit 118 may be circular. The primary T/R coil 302 can be passively shielded by a secondary coil 304 of one or more turns of wire with a larger area than that of the primary T/R coil 302. The loop size ($r_{primary}$, and $r_{secondary}$) and number of turns ($N_{primary}$, $N_{secondary}$) of the primary 302 and secondary 304 coils, respectively, may be determined based on a total flux ratio, $\alpha$, given by $$\alpha = \frac{N_{primary} * (r_{primary})^2}{N_{secondary} * (r_{secondary})^2}$$

The flux ratio, $\alpha$, can be used to control the flux profile through the primary RF coil and outside the primary RF coil. Preferably, the flux ratio can be chosen to increase total magnetic flux through the primary RF coil and reduce the total magnetic flux outside the primary RF coil. For example, $\alpha$ may be chosen to maximize the magnetic flux inside the primary coil and minimize the magnetic flux outside the primary RF coil. As a non-limiting example, in order to cancel out the total magnetic flux outside of the coil region, the total flux ratio can be set to 1 (i.e., $\alpha=1$). For a primary coil 302 with ten turns and a 10 cm radius (i.e., $N_{primary}=10$ and $r_{primary}=10$ cm), the secondary coil 304 may have five turns and a radius of $10\sqrt{2}$ cm (i.e., $N_{secondary}=5$ and $r_{secondary}=10\sqrt{2}$ cm). However, other loop sizes and numbers of turns, including integers or non-integers, may be chosen to achieve a desired flux ratio ($\alpha$). The flux ratio ($\alpha$) may also be tuned based on the interaction between the primary and secondary RF coils, the interaction with neighboring conductors or coils, or incident radiation from the environment. Thus, theoretically, $\alpha$ may be preferably chosen as $\alpha=1$, but in practice, it may be tuned such that $\alpha \neq 1$.

The secondary coil 304 may be held at ground relative to the primary coil 302 and cancel induced signal in the primary coil 302 from distant sources by shifting ground relative to the flux across the larger secondary coil 304. The secondary coil 304 can also allow for easier decoupling from nearby coil units by cancelling total flux when partially overlapped. The coil units 118 may be arranged such that the primary coils 302 overlap with neighboring primary coils 302, the secondary coils 304 may be overlapped with neighboring secondary coils 304, the primary coils 302 overlap with neighboring secondary coils 304, or some combination thereof, The variable number of coil turns and coil sizes of the primary 302 and secondary 304 coils provides flexibility in the arrangement of individual coil units 118. The coils can have arbitrary sizes, as the flux profile and coil shielding can be controlled based on the number of turns in each coil loop. In some implementations, the flexibility of the system may allow for reduced space and material requirements as compared to other passive methods. Multiple coils of various sizes can be also distributed in order to control the imaging field of view and coil sensitivity profile.

The primary coil 302 and secondary coil 304 may alternatively be characterized by any equivalent 2-dimensional shapes centered at the same point. For example, the primary and secondary coils 302, 304 may be hexagons. For an arbitrary shape, the flux ratio, $\alpha_{arb}$, can be described as:

$$\alpha_{arb} = \frac{N_{primary} * A_{primary}}{N_{secondary} * A_{secondary}}$$

where $A_{primary}$ and $A_{secondary}$ are the areas of the primary and secondary coils, respectively. Various other flux profiles can be achieved using arbitrarily shaped coils, unequal numbers of primary and secondary coils, or by shifting the secondary coil relative to the primary coil along the 2D surface of the coils.

After the signal is excited by the TN components of the TRN 102, the T/R switch 124 can connect the coil unit 118 to the RN components of the TRN 102 to receive the induced signal. The signal acquired by the coil unit 118 can be cleaned by one or more filters 126 and amplified by the preamplifier 128. The mixer/ADC module 130 can mix the signal with the center driving frequency, supplied by the FPGA 226 (FIG. 2), which can correspond to the resonant frequency of the nuclei of interest in the primary field. The mixer/ADC module 130 also includes an analog to digital converter (ADC), which may be an off-the-shelf ADC, that digitizes the signal. The signal may then be sent to the CN 106 for processing via the wireless connection 104 or other connection.

As described, the system and methods may be implemented without gradient coils in the context of low-field imaging or low-field quantitative imaging, reducing the costs of the T/R equipment by an estimated 95%. This could reduce the overall system cost, including the main magnet, by 60% and allow for less specialized fabrication and maintenance. The site and operating requirements would be reduced significantly by decreasing the need for dedicated electrical power during scans. This is in great contrast to the standard systems, which require a large initial investment, ongoing costs for large amounts of uninterrupted power, and complicated peripherals like liquid helium cooling systems.

In lieu of gradient coils, the spatial distribution of the coil units 118 may be used to spatially encode the signal induced and measured by the coil units 118. Additionally or alternatively, the coil units 118 can generate RF pulses that are characterized by a phase, which can spatially encode the RF signals. The use of the RF system 100 is not limited to gradient-free MRI systems, and gradient systems may optionally be used for spatial encoding or to generate contrast like diffusion, etc.

Figure 4:
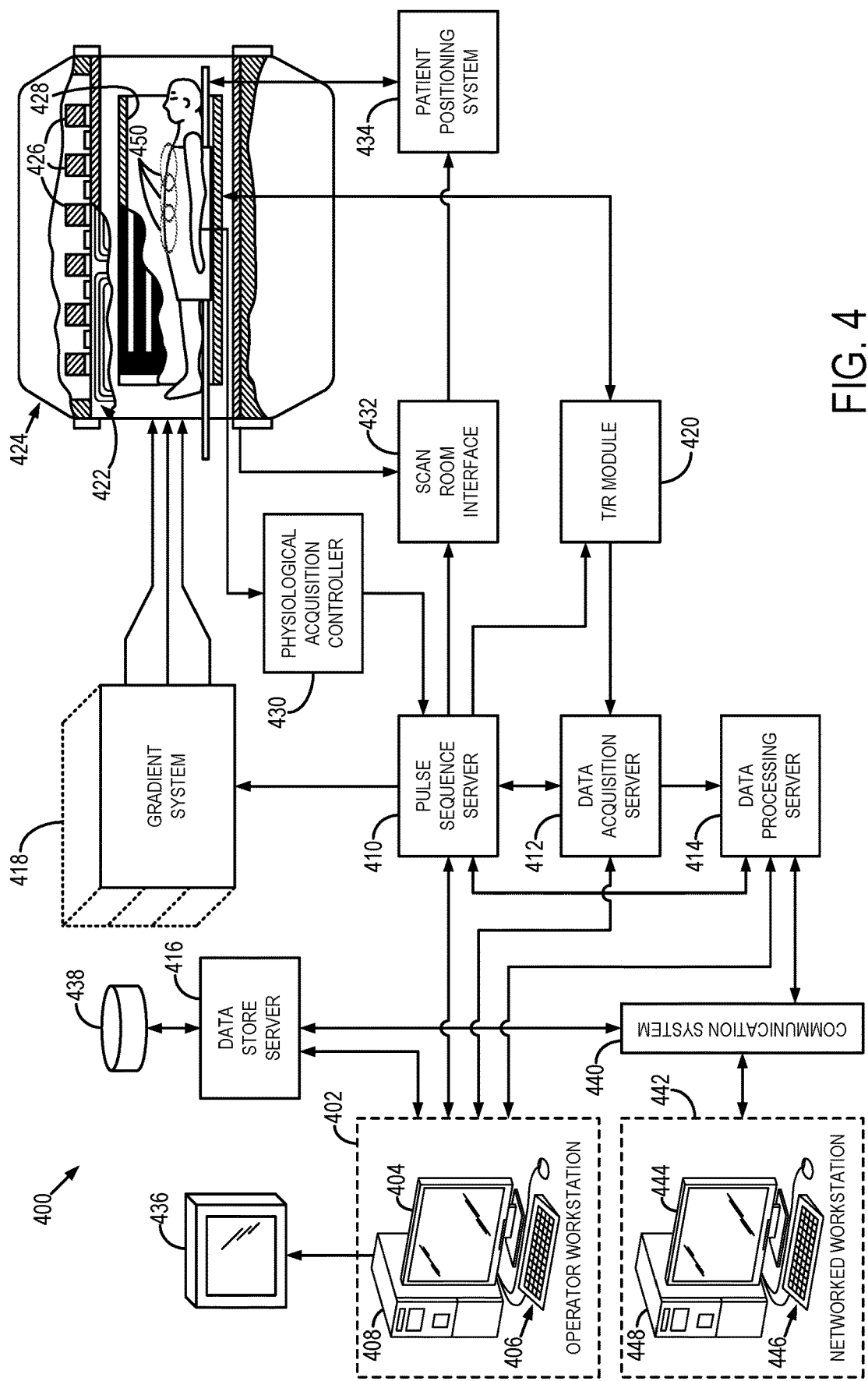
FIG. 4 is a block diagram of an example magnetic resonance imaging ("MM") system that includes the transmit/receive RF system described in the present disclosure.

Referring particularly now to FIG. 4, an example of an MRI system 400 that can include a T/R RF system and perform imaging is illustrated. The MRI system 400 includes an operator workstation 402 that may include a display 404, one or more input devices 406 (e.g., a keyboard, a mouse), and a processor 408. The processor 408 may include a commercially available programmable machine running a commercially available operating system. The operator workstation 402 provides an operator interface that facilitates entering scan parameters into the MRI system 400. The operator workstation 402 may be coupled to different servers, including, for example, a pulse sequence server 410, a data acquisition server 412, a data processing server 414, and a data store server 416. The operator workstation 402 and the servers 410, 412, 414, and 416 may be connected via a communication system 440, which may include wired or wireless network connections.

The MRI system 400 also includes a magnet assembly 424 that includes a polarizing magnet 426, which may be a low-field magnet. For example, the low-field magnet may include a superconducting magnet or permanent magnet. The MRI system 500 may optionally include a whole-body RF coil 428 and a gradient system 418 that controls a gradient coil assembly 422.

The pulse sequence server 410 functions in response to instructions provided by the operator workstation 402 to operate a T/R module 420. For example, the T/R module 420 may control the coil nodes 450. The coil nodes 450 may be positioned on the body of the patient to control the localized T/R coils (e.g., 302 and 304). For example, The coil nodes 450 may include a center node 106 and transceive nodes 102, as described in the context of FIG. 1.

RF waveforms are applied by the T/R module 420 to the RF coil 428, or the localized coil nodes 450 to perform the prescribed magnetic resonance pulse sequence. Responsive magnetic resonance signals detected by the RF coil 428 or the localized coil nodes 450 can be acquired by the T/R module 420. The responsive magnetic resonance signals may be amplified, demodulated, filtered, and digitized under direction of commands produced by the pulse sequence server 410. The T/R module 420 can include or otherwise control an RF transmitter for producing a wide variety of RF pulses used in MM pulse sequences. The RF transmitter is responsive to the prescribed scan and direction from the pulse sequence server 410 to produce RF pulses of the desired frequency, phase, and pulse amplitude waveform. The generated RF pulses may be applied to the whole-body RF coil 428 or to one or more local coil nodes 450.

The T/R module 420 may also include one or more RF receiver channels. An RF receiver channel includes an RF preamplifier that amplifies the magnetic resonance signal received by the coil 428 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2}$$

and the phase of the received magnetic resonance signal may also be determined according to the following relationship:

$$\varphi = \tan^{-1}\left(\frac{Q}{I}\right)$$

The pulse sequence server 410 may receive patient data from a physiological acquisition controller 430. By way of example, the physiological acquisition controller 430 may receive signals from a number of different sensors connected to the patient, including electrocardiograph ("ECG") signals from electrodes, or respiratory signals from a respiratory bellows or other respiratory monitoring devices. These signals may be used by the pulse sequence server 410 to synchronize, or "gate," the performance of the scan with the subject's heartbeat or respiration.

The pulse sequence server 410 may also connect to a scan room interface circuit 432 that receives signals from various sensors associated with the condition of the patient and the magnet system. Through the scan room interface circuit 432, a patient positioning system 434 can receive commands to move the patient to desired positions during the scan.

The digitized magnetic resonance signal samples produced by the T/R module 420 are received by the data acquisition server 412. The data acquisition server 412 operates in response to instructions downloaded from the operator workstation 402 to receive the real-time magnetic resonance data and provide buffer storage, so that data are not lost by data overrun. In some scans, the data acquisition server 412 passes the acquired magnetic resonance data to the data processor server 414. In scans that require information derived from acquired magnetic resonance data to control the further performance of the scan, the data acquisition server 412 may be programmed to produce such information and convey it to the pulse sequence server 410. For example, during pre-scans, magnetic resonance data may be acquired and used to calibrate the pulse sequence performed by the pulse sequence server 410. As another example, navigator signals may be acquired and used to adjust the operating parameters of the T/R module 420 or the gradient system 418, or to control the view order in which k-space is sampled. In still another example, the data acquisition server 412 may also process magnetic resonance signals used to detect the arrival of a contrast agent in a magnetic resonance angiography ("MRA") scan. For example, the data acquisition server 412 may acquire magnetic resonance data and processes it in real-time to produce information that is used to control the scan.

The data processing server 414 receives magnetic resonance data from the data acquisition server 412 and processes the magnetic resonance data in accordance with instructions provided by the operator workstation 402. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 414 are conveyed back to the operator workstation 402 for storage. Real-time images may be stored in a data base memory cache, from which they may be output to operator display 402 or a display 436. Batch mode images or selected real time images may be stored in a host database on disc storage 438. When such images have been reconstructed and transferred to storage, the data processing server 414 may notify the data store server 416 on the operator workstation 402. The operator workstation 402 may be used by an operator to archive the images, produce films, or send the images via a network to other facilities.

The MM system 400 may also include one or more networked workstations 442. For example, a networked workstation 442 may include a display 444, one or more input devices 446 (e.g., a keyboard, a mouse), and a processor 448. The networked workstation 442 may be located within the same facility as the operator workstation 402, or in a different facility, such as a different healthcare institution or clinic.

The networked workstation 442 may gain remote access to the data processing server 414 or data store server 416 via the communication system 440. Accordingly, multiple networked workstations 442 may have access to the data processing server 414 and the data store server 416. In this manner, magnetic resonance data, reconstructed images, or other data may be exchanged between the data processing server 414 or the data store server 416 and the networked workstations 442, such that the data or images may be remotely processed by a networked workstation 442.

Figure 5:
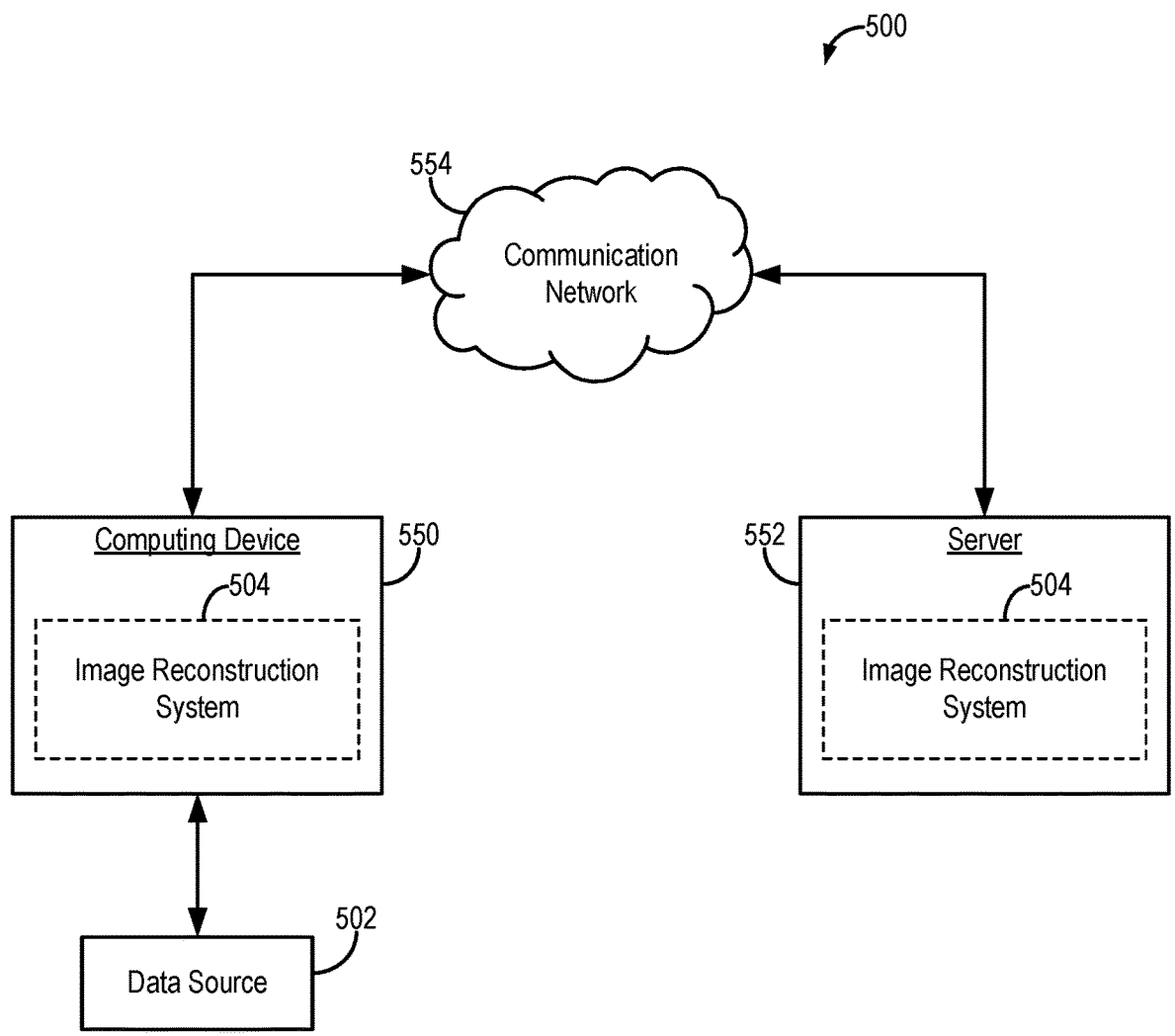
FIG. 5 is a block diagram of an image reconstruction system that can implement the methods of the present disclosure.

Referring now to FIG. 5, an example of an MRI system 500 is shown, which may be used in accordance with some aspects of the systems and methods described in the present disclosure. As shown in FIG. 5, a computing device 550 can receive one or more types of data (e.g., signal evolution data, k-space data, receiver coil sensitivity data) from data source 502. In some configurations, computing device 550 can execute at least a portion of an image reconstruction system 504 to reconstruct images from magnetic resonance data (e.g., k-space data) acquired using a passively shielded T/R system. In some configurations, the image reconstruction system 504 can implement an automated pipeline to provide MRI images, MRF maps, MRF synthetic images, etc.

Additionally or alternatively, in some configurations, the computing device 550 can communicate information about data received from the data source 502 to a server 552 over a communication network 554, which can execute at least a portion of the image reconstruction system 504. In such configurations, the server 552 can return information to the computing device 550 (and/or any other suitable computing device) indicative of an output of the image reconstruction system 504.

In some configurations, computing device 550 and/or server 552 can be any suitable computing device or combination of devices, such as a desktop computer, a laptop computer, a smartphone, a tablet computer, a wearable computer, a server computer, a virtual machine being executed by a physical computing device, and so on. The computing device 550 and/or server 552 can also reconstruct images from the data.

In some configurations, data source 502 can be any suitable source of data (e.g., measurement data, images reconstructed from measurement data, processed image data), such as an MRI system, another computing device (e.g., a server storing measurement data, images reconstructed from measurement data, processed image data), and so on. In some configurations, data source 502 can be local to computing device 550. For example, data source 502 can be incorporated with computing device 550 (e.g., computing device 550 can be configured as part of a device for measuring, recording, estimating, acquiring, or otherwise collecting or storing data). As another example, data source 502 can be connected to computing device 550 by a cable, a direct wireless link, and so on. Additionally or alternatively, in some configurations, data source 502 can be located locally and/or remotely from computing device 550, and can communicate data to computing device 550 (and/or server 552) via a communication network (e.g., communication network 554).

In some configurations, communication network 554 can be any suitable communication network or combination of communication networks. For example, communication network 554 can include a Wi-Fi network (which can include one or more wireless routers, one or more switches, etc.), a peer-to-peer network (e.g., a Bluetooth network), a cellular network (e.g., a 3G network, a 4G network, etc., complying with any suitable standard, such as CDMA, GSM, LTE, LTE Advanced, WiMAX, etc.), other types of wireless network, a wired network, and so on. In some configurations, communication network 554 can be a local area network, a wide area network, a public network (e.g., the Internet), a private or semi-private network (e.g., a corporate or university intranet), any other suitable type of network, or any suitable combination of networks. Communications links shown in FIG. 5 can each be any suitable communications link or combination of communications links, such as wired links, fiber optic links, Wi-Fi links, Bluetooth links, cellular links, and so on.

Figure 6:
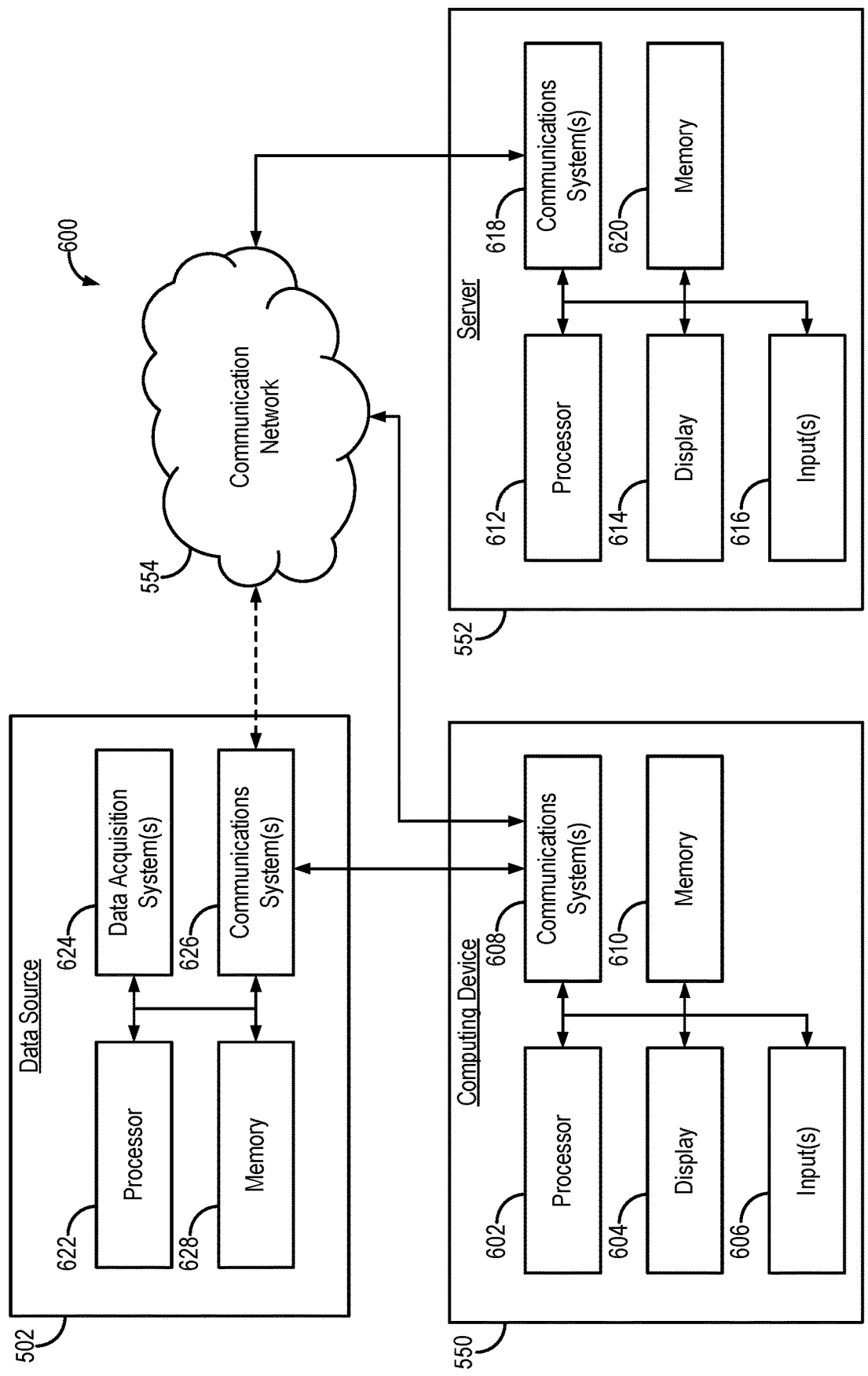
FIG. 6 is a block diagram of example components that can implement the system of FIG. 5.

Referring now to FIG. 6, an example of hardware 600 that can be used to implement data source 502, computing device 550, and server 552 in accordance with some configurations of the systems and methods described in the present disclosure is shown.

As shown in FIG. 6, in some configurations, computing device 550 can include a processor 602, a display 604, one or more inputs 606, one or more communication systems 608, and/or memory 610. In some configurations, processor 602 can be any suitable hardware processor or combination of processors, such as a central processing unit ("CPU"), a graphics processing unit ("GPU"), and so on. In some configurations, display 604 can include any suitable display devices, such as a liquid crystal display ("LCD") screen, a light-emitting diode ("LED") display, an organic LED ("OLED") display, an electrophoretic display (e.g., an "e-ink" display), a computer monitor, a touchscreen, a television, and so on. In some configurations, inputs 606 can include any suitable input devices and/or sensors that can be used to receive user input, such as a keyboard, a mouse, a touchscreen, a microphone, and so on.

In some configurations, communications systems 608 can include any suitable hardware, firmware, and/or software for communicating information over communication network 554 and/or any other suitable communication networks. For example, communications systems 608 can include one or more transceivers, one or more communication chips and/or chip sets, and so on. In a more particular example, communications systems 608 can include hardware, firmware, and/or software that can be used to establish a Wi-Fi connection, a Bluetooth connection, a cellular connection, an Ethernet connection, and so on.

In some configurations, memory 610 can include any suitable storage device or devices that can be used to store instructions, values, data, or the like, that can be used, for example, by processor 602 to present content using display 604, to communicate with server 552 via communications system(s) 608, and so on. Memory 610 can include any suitable volatile memory, non-volatile memory, storage, or any suitable combination thereof. For example, memory 610 can include random-access memory ("RAM"), read-only memory ("ROM"), electrically programmable ROM ("EPROM"), electrically erasable ROM ("EEPROM"), other forms of volatile memory, other forms of non-volatile memory, one or more forms of semi-volatile memory, one or more flash drives, one or more hard disks, one or more solid state drives, one or more optical drives, and so on. In some configurations, memory 610 can have encoded thereon, or otherwise stored therein, a computer program for controlling operation of computing device 550. In such configurations, processor 602 can execute at least a portion of the computer program to present content (e.g., images, user interfaces, graphics, tables), receive content from server 552, transmit information to server 552, and so on. For example, the processor 602 and the memory 610 can be configured to perform the methods described herein.

In some configurations, server 552 can include a processor 612, a display 614, one or more inputs 616, one or more communications systems 618, and/or memory 620. In some configurations, processor 612 can be any suitable hardware processor or combination of processors, such as a CPU, a GPU, and so on. In some configurations, display 614 can include any suitable display devices, such as an LCD screen, LED display, OLED display, electrophoretic display, a computer monitor, a touchscreen, a television, and so on. In some configurations, inputs 616 can include any suitable input devices and/or sensors that can be used to receive user input, such as a keyboard, a mouse, a touchscreen, a microphone, and so on.

In some configurations, communications systems 618 can include any suitable hardware, firmware, and/or software for communicating information over communication network 554 and/or any other suitable communication networks. For example, communications systems 618 can include one or more transceivers, one or more communication chips and/or chip sets, and so on. In a more particular example, communications systems 618 can include hardware, firmware, and/or software that can be used to establish a Wi-Fi connection, a Bluetooth connection, a cellular connection, an Ethernet connection, and so on.

In some configurations, memory 620 can include any suitable storage device or devices that can be used to store instructions, values, data, or the like, that can be used, for example, by processor 612 to present content using display 614, to communicate with one or more computing devices 550, and so on. Memory 620 can include any suitable volatile memory, non-volatile memory, storage, or any suitable combination thereof. For example, memory 620 can include RAM, ROM, EPROM, EEPROM, other types of volatile memory, other types of non-volatile memory, one or more types of semi-volatile memory, one or more flash drives, one or more hard disks, one or more solid state drives, one or more optical drives, and so on. In some configurations, memory 620 can have encoded thereon a server program for controlling operation of server 552. In such configurations, processor 612 can execute at least a portion of the server program to transmit information and/or content (e.g., data, images, a user interface) to one or more computing devices 550, receive information and/or content from one or more computing devices 550, receive instructions from one or more devices (e.g., a personal computer, a laptop computer, a tablet computer, a smartphone), and so on.

In some configurations, the server 552 is configured to perform the methods described in the present disclosure. For example, the processor 612 and memory 620 can be configured to perform the methods described herein.

In some configurations, data source 502 can include a processor 622, one or more data acquisition systems 624, one or more communications systems 626, and/or memory 628. In some configurations, processor 622 can be any suitable hardware processor or combination of processors, such as a CPU, a GPU, and so on. In some configurations, the one or more data acquisition systems 624 are generally configured to acquire data, images, or both, and can include an MRI system. Additionally or alternatively, in some configurations, the one or more data acquisition systems 624 can include any suitable hardware, firmware, and/or software for coupling to and/or controlling operations of an MRI system. In some configurations, one or more portions of the data acquisition system(s) 624 can be removable and/or replaceable.

Note that, although not shown, data source 502 can include any suitable inputs and/or outputs. For example, data source 502 can include input devices and/or sensors that can be used to receive user input, such as a keyboard, a mouse, a touchscreen, a microphone, a trackpad, a trackball, and so on. As another example, data source 502 can include any suitable display devices, such as an LCD screen, an LED display, an OLED display, an electrophoretic display, a computer monitor, a touchscreen, a television, etc., one or more speakers, and so on.

In some configurations, communications systems 626 can include any suitable hardware, firmware, and/or software for communicating information to computing device 550 (and, in some configurations, over communication network 554 and/or any other suitable communication networks). For example, communications systems 626 can include one or more transceivers, one or more communication chips and/or chip sets, and so on. In a more particular example, communications systems 626 can include hardware, firmware, and/or software that can be used to establish a wired connection using any suitable port and/or communication standard (e.g., VGA, DVI video, USB, RS-232, etc.), Wi-Fi connection, a Bluetooth connection, a cellular connection, an Ethernet connection, and so on.

In some configurations, memory 628 can include any suitable storage device or devices that can be used to store instructions, values, data, or the like, that can be used, for example, by processor 622 to control the one or more data acquisition systems 624, and/or receive data from the one or more data acquisition systems 624; to generate images from data; present content (e.g., data, images, a user interface) using a display; communicate with one or more computing devices 550; and so on. Memory 628 can include any suitable volatile memory, non-volatile memory, storage, or any suitable combination thereof. For example, memory 628 can include RAM, ROM, EPROM, EEPROM, other types of volatile memory, other types of non-volatile memory, one or more types of semi-volatile memory, one or more flash drives, one or more hard disks, one or more solid state drives, one or more optical drives, and so on. In some configurations, memory 628 can have encoded thereon, or otherwise stored therein, a program for controlling operation of medical image data source 502. In such configurations, processor 622 can execute at least a portion of the program to generate images, transmit information and/or content (e.g., data, images, a user interface) to one or more computing devices 550, receive information and/or content from one or more computing devices 550, receive instructions from one or more devices (e.g., a personal computer, a laptop computer, a tablet computer, a smartphone, etc.), and so on.

In some configurations, any suitable computer-readable media can be used for storing instructions for performing the functions and/or processes described herein. For example, in some configurations, computer-readable media can be transitory or non-transitory. For example, non-transitory computer-readable media can include media such as magnetic media (e.g., hard disks, floppy disks), optical media (e.g., compact discs, digital video discs, Blu-ray discs), semiconductor media (e.g., RAM, flash memory, EPROM, EEPROM), any suitable media that is not fleeting or devoid of any semblance of permanence during transmission, and/or any suitable tangible media. As another example, transitory computer-readable media can include signals on networks, in wires, conductors, optical fibers, circuits, or any suitable media that is fleeting and devoid of any semblance of permanence during transmission, and/or any suitable intangible media.

As used herein in the context of computer implementation, unless otherwise specified or limited, the terms "component," "system," "module," "controller," "framework," and the like are intended to encompass part or all of computer-related systems that include hardware, software, a combination of hardware and software, or software in execution. For example, a component may be, but is not limited to being, a processor device, a process being executed (or executable) by a processor device, an object, an executable, a thread of execution, a computer program, or a computer. By way of illustration, both an application running on a computer and the computer can be a component. One or more components (or system, module, and so on) may reside within a process or thread of execution, may be localized on one computer, may be distributed between two or more computers or other processor devices, or may be included within another component (or system, module, and so on).

In some implementations, devices or systems disclosed herein can be utilized or installed using methods embodying aspects of the disclosure. Correspondingly, description herein of particular features, capabilities, or intended purposes of a device or system is generally intended to inherently include disclosure of a method of using such features for the intended purposes, a method of implementing such capabilities, and a method of installing disclosed (or otherwise known) components to support these purposes or capabilities. Similarly, unless otherwise indicated or limited, discussion herein of any method of manufacturing or using a particular device or system, including installing the device or system, is intended to inherently include disclosure, as embodiments of the disclosure, of the utilized features and implemented capabilities of such device or system.

As used herein, the phrase "at least one of A, B, and C" means at least one of A, at least one of B, and/or at least one of C, or any one of A, B, or C or combination of A, B, or C. A, B, and C are elements of a list, and A, B, and C may be anything contained in the Specification.

The present disclosure has described one or more preferred embodiments, and it should be appreciated that many equivalents, alternatives, variations, and modifications, aside from those expressly stated, are possible and within the scope of the invention.

The invention claimed is:

1. A radiofrequency (RF) system for magnetic resonance imaging (MRI) or nuclear magnetic resonance (NMR) processes, the RF system comprising:
   a center node; and
   a plurality of passively shielded coil nodes, wherein each of the coil nodes comprises:
      a primary RF coil having a primary loop size and a primary number of turns;
      a secondary RF coil configured to passively shield the primary RF coil by having a secondary loop size and a secondary number of turns selected based on a total flux ratio that is a function of the primary loop size and the primary number of turns; and
      a control system comprising a power module coupled to the respective coil node and configured for switch mode operation to control delivery of power from a power supply to the respective coil node.

2. The RF system of claim 1, wherein the center node is in communication with each of the plurality of coil nodes and is configured to provide a control signal to each of the plurality of coil nodes.

3. The RF system of claim 1, wherein the flux ratio is used to increase total magnetic flux through the primary RF coil and reduce a second total magnetic flux outside the primary RF coil.

4. The RF system of claim 1, wherein the flux ratio is used to maximize total magnetic flux through the primary RF coil and minimize a second total magnetic flux outside the primary RF coil.

5. The RF system of claim 1, wherein the total flux ratio defined as:

$$\alpha = \frac{N_{primary} * (r_{primary})^2}{N_{secondary} * (r_{secondary})^2}$$

wherein, $N_{primary}$ is the primary number of turns, primary is the primary loop size, $N_{secondary}$ is the second number of turns, and $r_{secondary}$ is the secondary loop size.

6. The RF system of claim 5, wherein $\alpha=1$.

7. The RF system of claim 1, wherein the secondary RF coil overlaps with a neighboring secondary RF coil.

8. The RF system of claim 1, wherein the control system is configured to implement a duty cycle with dynamic phase modulation configured to generate flat amplitude phase modulated pulses.

9. A radio frequency (RF) system for magnetic resonance imaging (MRI) or nuclear magnetic resonance (NMR) processes, the RF system comprising a plurality of coil nodes, wherein each of the coil nodes comprises:
   a primary multi-turn RF coil, wherein the primary multi-turn RF coil is configured to transmit and receive RF signals;
   a secondary multi-turn RF coil, wherein the secondary multi-turn RF coil is configured to passively shield the primary multi-turn RF coil; and
   a control system comprising a plurality of power modules, wherein each of the power modules is positioned on a respective one of the coil nodes and configured for switch mode operation to control delivery of power from a power supply to the respective coil node.

10. The RF system of claim 9, wherein the secondary RF coil overlaps with a neighboring secondary RF coil.

11. The RF system of claim 9, wherein the control system is configured to implement a duty cycle with dynamic phase modulation configured to generate flat amplitude phase modulated pulses.

12. A radio frequency (RF) system for magnetic resonance imaging (MRI) or nuclear magnetic resonance (NMR) processes, the RF system comprising:
a center node;
a plurality of coil nodes, wherein each of the coil nodes comprises an RF coil including a primary multi-turn RF coil, wherein the primary multi-turn RF soil is configured to transmit and receive RF signals and a secondary multi-turn RF coil configured to passively shield the primary multi-turn RF coil; and
a control system comprising a plurality of power modules, each comprising a current mode class D (CMCD) topology that comprises field effect transistors (FETs), wherein each of the plurality of power modules is configured for switch mode operation to control delivery of power from a power supply to one of the coil nodes.

13. The RF system of claim 12, wherein each of the plurality of coil nodes is configured to operate as a transmit node, receive node, or transceive node.

14. The RF system of claim 12, wherein the plurality of coil nodes receives a field programmable gate array (FPGA) configuration coordinated by the center node.

15. The RF system of claim 12, wherein the RF coils are passively shielded.

16. The RF system of claim 12, wherein the control system includes a plurality of field programmable gate arrays coupled to the respective coil node.

17. The RF system of claim 12, wherein each of the power modules is housed directly on one of the RF coils.

18. An RF system for magnetic resonance imaging (MRI) or nuclear magnetic resonance (NMR) processes, the RF system comprising:
a center node; and
a plurality of passively shielded coil nodes, wherein each of the coil nodes comprises:
a primary RF coil having a primary loop size and a primary number of turns; and
a secondary RF coil configured to passively shield the primary RF coil by having a secondary loop size and a secondary number of turns selected based on a total flux ratio that is a function of the primary loop size and the primary number of turns.

19. The RF system of claim 18, wherein the flux ratio is used to increase total magnetic flux through the primary RF coil and reduce a second total magnetic flux outside the primary RF coil.

20. The RF system of claim 18, wherein the flux ratio is used to maximize total magnetic flux through the primary RF coil and minimize a second total magnetic flux outside the primary RF coil.

21. The RF system of claim 18, wherein the total flux ratio defined as:

$$\alpha = \frac{N_{primary} * (r_{primary})^2}{N_{secondary} * (r_{secondary})^2}$$

wherein, $N_{primary}$ is the primary number of turns, $r_{primary}$ is the primary loop size, $N_{secondary}$ is the second number of turns, and $r_{secondary}$ is the secondary loop size.

22. The RF system of claim 21, wherein $\alpha=1$.

* * * * *

UNITED STATES PATENT AND TRADEMARK OFFICE
CERTIFICATE OF CORRECTION

| | | |
|---|---|---|
| PATENT NO. | : 12,253,587 B2 | Page 1 of 1 |
| APPLICATION NO. | : 18/181863 | |
| DATED | : March 18, 2025 | |
| INVENTOR(S) | : Nicholas Reid Bolding and Mark A. Griswold | |

It is certified that error appears in the above-identified patent and that said Letters Patent is hereby corrected as shown below:

In the Claims

Claim 5, Column 14, Line 42, "wherein, $N_{primary}$ is the primary number of turns, primary" should be --wherein $N_{primary}$ is the primary number of turns, $r_{primary}$--.

Signed and Sealed this
Sixteenth Day of December, 2025

John A. Squires
*Director of the United States Patent and Trademark Office*